United States Patent [19]

Snyder et al.

[11] Patent Number: 5,046,966

[45] Date of Patent: Sep. 10, 1991

[54] COAXIAL CABLE CONNECTOR ASSEMBLY

[75] Inventors: Keith A. Snyder; Paul E. Winkler, both of Vestal, N.Y.

[73] Assignee: International Business Machines Corporation, Armonk, N.Y.

[21] Appl. No.: 593,843

[22] Filed: Oct. 5, 1990

[51] Int. Cl.[5] ............................................. H01R 17/18
[52] U.S. Cl. ..................................... 439/579; 439/63; 439/98
[58] Field of Search ................... 439/579, 581, 63, 65, 439/66, 507–515, 607, 608, 98

[56] References Cited

U.S. PATENT DOCUMENTS

| 3,551,874 | 12/1970 | Volinskie | 339/17 |
| 3,910,665 | 10/1975 | Stull | 339/17 |
| 4,012,099 | 3/1977 | Worcester | 339/75 |
| 4,534,602 | 8/1985 | Bley | 339/14 |
| 4,895,521 | 1/1989 | Grabbe | 439/63 |
| 4,941,831 | 7/1990 | Tengler et al. | 439/63 |

FOREIGN PATENT DOCUMENTS

| 0137370 | 4/1985 | European Pat. Off. | 439/63 |
| 0311041 | 4/1989 | European Pat. Off. | 439/579 |
| 8802560 | 4/1988 | World Int. Prop. O. | 439/63 |

OTHER PUBLICATIONS

IBM Technical Disclosure Bulletin, vol. 5, No. 4, Sep., 1962, "Pluggable Cable to Card Connector", by Palmateer.
IBM Technical Disclosure Bulletin, vol. 2, No. 11, Apr., 1970, "Coaxial Circuit Board Connector", by Uberbacher.
IBM Technical Disclosure Bulletin, vol. 16, No. 11, Apr., 1974, "Phased Matched Electrical Spacer", by Clouser et al.
IBM Technical Disclosure Bulletin, vol. 17, No. 5, Oct., 1974, "Matched Impedance Coaxial Cable Connector", by Morton.
IBM Technical Disclosure Bulletin, vol. 19, No. 6, Nov., 1976, "Coaxial-To-Stripline Spacer", by Clouser et al.
IBM Technical Disclosure Bulletin, vol. 20, No. 5, Oct., 1977, "Quick Disconnect Coaxial Connector", by Chang et al.
IBM Technical Disclosure Bulletin, vol. 21, No. 10, Mar., 1979, "Coaxial Connector", by Heath et al.
IBM Technical Disclosure Bulletin, vol. 28, No. 7, "System Comprising Densely Populated Coax Cable Terminations to Printed Circuit Board", by Manca.

Primary Examiner—David L. Pirlot
Attorney, Agent, or Firm—Lawrence R. Fraley

[57] ABSTRACT

A connector assembly for connecting several coaxial cables to a circuit board such that the center conductors of each cable are inserted within a conductive hole which forms part of the board structure. The assembly includes a common housing which may be electrically conductive or insulative and a spring contact member which serves as part of the grounding means to effectively ground the shield members of the coaxial cables to the board's ground. The spring contacts may be in the form of resilient springs which extend from the assembly or of compressible members coupled to a conductive layer which in turn is connected to the shield members. An apparatus for positioning more than one such assembly on a common board structure is also shown and described, as is an assembly designed for positioning the cables therein in a substantially compact orientation.

16 Claims, 4 Drawing Sheets

COAXIAL CABLE CONNECTOR ASSEMBLY

DESCRIPTION

The invention relates to coaxial connector assemblies and particularly to such assemblies for connecting to printed circuit boards.

BACKGROUND OF THE INVENTION

Various connector assemblies for connecting coaxial cables (e.g., to circuit board structures or the like) are illustrated in U.S. Pat. Nos. 3,551,874 3,910,665, 4,012,099 and 4,534,602. It is known, e.g., as described in the foregoing patents, that the connection or termination of coaxial cable(s) to a circuit board structure or the like requires the termination of two parallel conductors for each cable (e.g., the outer shield member and the interior conductor member). Additionally, such connection must assure the characteristic impedance of the coaxial cable when so connected. When connecting a plurality of such cables, positive retention and alignment thereof with respect to the corresponding circuit board circuitry is essential. Equally significant, connection between the board's active ground plane and the shield member of each cable (e.g, to prevent signal interference, a/k/a "noise") is an essential requirement in order to assure both electrically and mechanically sound, effective connections, particularly in any instance wherein closely positioned, aligned cables are to be connected.

The connector assembly as defined herein is capable of providing both electrically and mechanically sound and effective connection of a plurality of coaxial cables to the printed circuit board structure or the like in a safe and facile manner. The assembly, as will be described, is capable of providing such connection between several cables while maintaining these cables in a closely packed, highly dense arrangement, thereby assuring high density type connections within a relatively compact design. As will be further defined, such a connection is obtainable while substantially eliminating electromagnetic interference ("noise") which could adversely affect the overall performance of such an assembly. Equally significant, the invention as described is capable of providing the above in a pluggable fashion such that connection to and disconnection from the board can be effectively attained with relatively minimal effort.

It is believed that a coaxial connector assembly possessing the advantageous features cited above and discernible from the teachings herein would constitute a significant advancement in the art.

DISCLOSURE OF THE INVENTION

It is, therefore, a primary object of the present invention to enhance the art of coaxial connector assemblies and particularly that portion of the art dedicated to providing connections to printed circuit board structures or the like.

It is a further object of the invention to provide such a connector assembly which is capable of providing effective connection between a plurality of densely packaged coaxial cables and the circuitry of such a circuit board structure wherein the assembly may be readily connected thereto and disconnected therefrom.

It is yet another object of the invention to provide such a connector assembly which is of relative simple construction, and which can be produced on a mass production scale, thus substantially reducing the overall costs thereof.

In accordance with one aspect of the invention, there is provided a connector assembly for electrically connecting a plurality of coaxial cables to a circuit board. The assembly comprises a common housing for being removably positioned from the board and including therein a plurality of coaxial cables arranged in a high density, aligned arrangement. Each cable includes a conductor for being positioned within a conductive hole located within the circuit board and a shielding member for shielding the pin conductor. The assembly further includes electrical grounding means located on or forming part of the common housing for providing an electrical connection between each shielding member and an electrical ground associated with the circuit board when the assembly's common housing is positioned atop (adjacent) the circuit board.

BEST MODE FOR CARRYING OUT THE INVENTION

For a better understanding of the present invention, together with other and further objects, advantages and capabilities thereof, reference is made to the following disclosure and appended claims in connection with the above-described drawings. Like numerals will be utilized throughout this description to define like elements.

The present invention as will be defined herein describes an assembly for providing high quality, high speed signal coaxial cable connections to a circuit device (e.g., printed circuit board), thus rendering the invention particularly useful in environments (e.g., computers) wherein such connections are demanded. Significantly, the connector assembly as defined herein renders possible the pluggable insertion of a plurality of coaxial cables directly into respective conductive holes (e.g., plated-through-holes) of a printed circuit board structure or the like in a simultaneous manner to thus assure a high density connection scheme while still assuring effective electrical grounding of all of the shielding members of these cables to the reference plane(s) of the circuit board, thereby allowing significantly reduced noise electrical performance.

Figure 1:
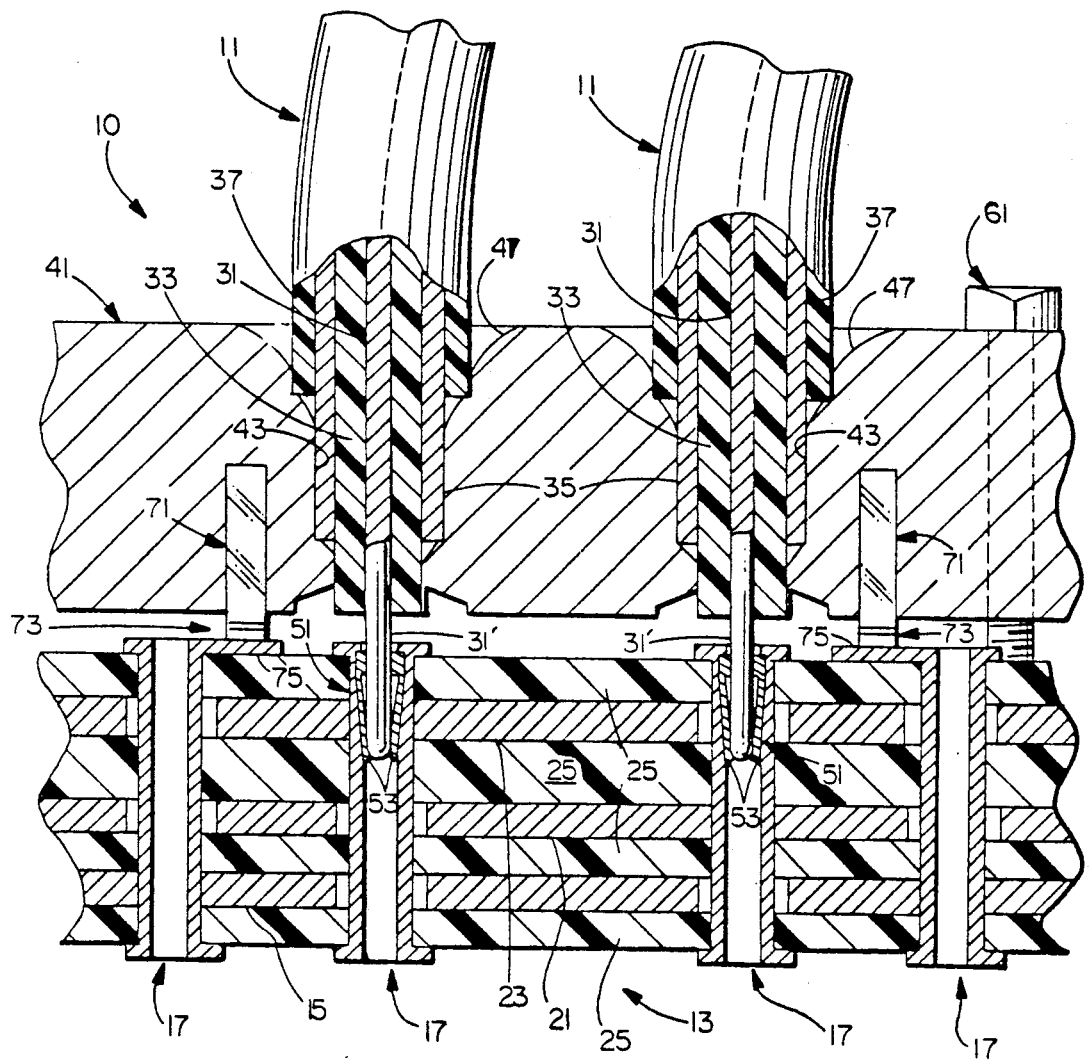
FIG. 1 is an enlarged front view, in section, of a connector assembly in accordance with one embodiment of the invention.

In FIG. 1, there is shown a connector assembly 10 in accordance with one embodiment of the invention. Assembly 10 is specifically designed for electrically connecting a plurality of coaxial cables 11 to a circuit board 13 which includes an electrical ground plane (e.g. conductive layer 15) as part thereof. Board 13 also includes a plurality of conductive holes 17 as part thereof, these holes, in one example of the invention, being in the form of conductively plated openings which extend through at least a portion of the entire thickness of board 13. In a preferred embodiment, these holes are in the form of what is referred to in the industry as plated-thru-holes, each typically having a conductive plating of copper or the like material extending substantially the entire depth thereof. Such holes may also be in the form of "vias", which, as is known in the art, are plated-thru-holes which extend between two or more conductive layers of a multilayered board structure but which may not necessarily extend through the entire thickness of the board.

In the embodiment of FIG. 1, board 13 is shown as comprising a plurality of layers of conductive material, as is typical in multilayered board structures known in the art. Thus, board 13 may comprise a known structure having such characteristics. Typically, such boards include a plurality of conductive layers which function as signal, power and/or ground components to meet the operational characteristics required of the board. Though only three such layers are illustrated in FIG. 1, this is of course not meant to limit the invention in that several additional such layers may be utilized. Typically, such board structures may comprise from about three to about forty conductive layers as part thereof. In the embodiment of FIG. 1, the upper two conductive layers (represented by the numerals 21 and 23) constitute signal layers. Such layers typically comprise a thickness within the range from about 0.001 inch to about 0.002 inch. To provide electrical isolation between the conductive layers, a plurality of layers of dielectric material 25 are utilized. These may be comprised of known dielectric materials used in circuit boards, including, e.g., polyimide, Teflon (a registered trademark of E. I. duPont deNemours and Company), etc. Board 13 preferably includes a staggered, two dimensional array of conductive holes each having an internal diameter of about 0.038 inch. These holes are spaced apart in such a highly dense arrangement wherein the average center-to-center distance between each adjacent pair of such holes is only about 0.070 inch. In such arrays, the number of holes per square inch may range from about 200 to about 300. The most dense of these arrays is referred to as a hexagon close packed array. In the embodiment of FIG. 1, the outermost conductive holes 17 (to the left and right) are thus understood to be electrically connected to the ground layer 15 while the innermost, two holes 17 (those coupled to the respective coaxial cables 11) are electrically coupled to a respective one of the signal layers 21 and 23.

Board 13, if utilized in a computer environment, may operate to provide switching, memory and/or logic functions in the overall system.

Each of the coaxial cables 11 for use in the invention may be constructed of several materials. Preferably, the center conductor 31 is a hard drawn metallic material (e.g., copper, or copper-beryllium alloy) so as to assure elastic and spring material properties sufficient to enable repeated insertion of the conductor 31 within a socket (described below) without bending, buckling, or the like of the pin. Such distortion of the central conductor may in turn result in plastic deformation thereof which in turn may seriously adversely affect subsequent conductor insertion. The center conductor should preferably be plated with a diffusion barrier (e.g., nickel) and an overplating of highly conductive, precious metal (e.g., gold) of sufficient thickness to provide mechanical and electrical properties required of electrical connectors of this type. The total external diameter for each coaxial cable 11 will vary, depending on the chosen dielectric, shielding component, characteristic impedance, and outer shell material utilized. With attention to FIG. 1, the aforementioned center conductor 31 preferably includes an external diameter of about 0.012 inch. The dielectric surrounding conductor 31 is preferably Teflon and has an external diameter of about 0.029 inch. Substantially surrounding the internal dielectric (referenced by the numeral 33) is the cable's shielding member 35. Shield member 35 may comprise braided metallic material (e.g., copper) or the like, as is known in the art. Member 35 preferably comprises an outer diameter of about 0.045 inch. Finally, each coaxial cable 11 includes an outer jacket or shell member 37 of insulative material (e.g., fluoro polymer). In one example of the invention, each cable 11 preferably possesses a total external diameter of about 0.055 inch with a center conductor 31 of about 0.012 inch to about 0.016 inch diameter. Alternatively, center conductor 31 may be comprised of multistranded metallic (e.g., copper) material having the projecting end 31' thereof appropriately plated with a metallic material (nickel). This plated structure should be "tinned" through immersion thereof in a molten eutectic solder composition (e.g., tin and gold). Such a procedure will serve to bind the strands together, resulting in a relatively stiff conductor that will withstand compressive insertion forces while assuring a substantially corrosion free surface, thereby assuring a reliable electrical connection.

Figure 3:
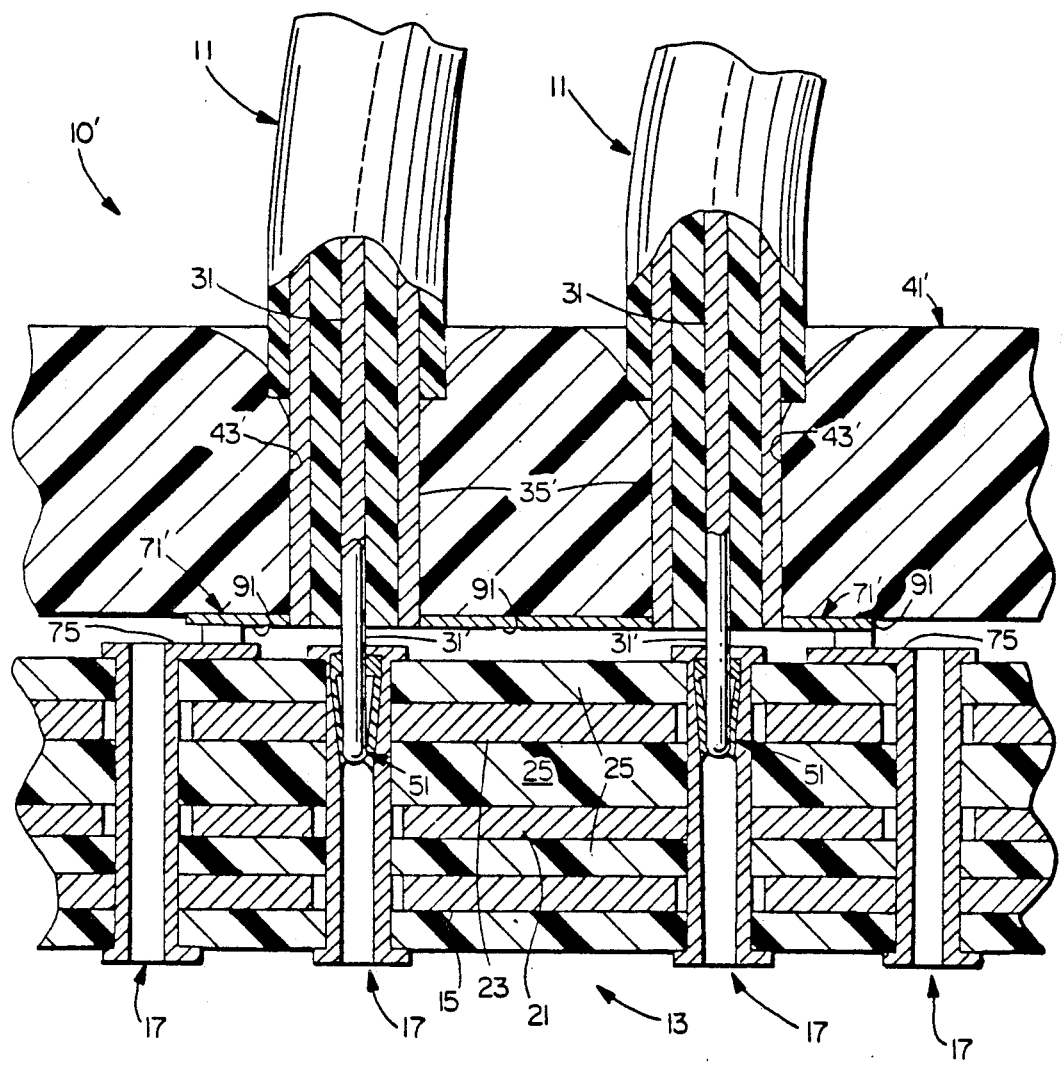
FIG. 3 is an enlarged front view, in section, of a connector assembly in accordance with another embodiment of the invention.

The aforedefined coaxial cables are positioned within a common housing member 41 so as to attain the high density array needed for the invention. Although only two such cables are depicted in FIGS. 1 and 3, it is understood that several such cables may be effectively retained within housing 41 and thus commonly connected to board 13. By way of example, a total of from about 200 to about 300 cables (preferably a comparable number to the aforementioned number of holes per square inch per array of said holes) having dimensions similar to those cited above may be retained within a boxlike common connector. Such a connector may have a variety of length and width dimensions (depending on the number of cables being contained therein) and a comparative thickness. In one example, housing 41 may include length and width dimensions of about 2.0 and 0.5 inches, respectively, (including also added spacing for positioning hardware) and a corresponding thickness of only about 0.250 to about 0.500 inch. When using the coaxial cables having the external diameters cited above, each of the cables are positioned within common housing 41 such that the center conductors 31 are spaced apart a distance of only about 0.058 inch, thereby providing an extremely small space of only about 0.015 inch between the external surfaces thereof. Each cable 11 is positioned within an aperture 43 formed within housing 41. In the embodiment of FIG. 1, each aperture 43 is of stepped configuration such that the conductive shielding members 35 extend a predetermined distance into the housing while the outer shell 37 extends a lesser distance. Ease of insertion of each cable is further assured by providing a taper 47 within the housing's upper surface.

For reasons defined below, housing 41 is preferably electrically conductive and thus comprised of suitable metallic material e.g., copper. Alternatively, housing 41 may be a polymer made conductive through use of appropriate filler materials, coating or plating. A preferred example is a glass-filled polyester. In situations wherein larger size housings are to be used, the selection of such material should be such that the coefficient of thermal expansion of the housing approximates that of said circuit board.

To achieve electrical connection with board 13, common housing 41 is located adjacent (atop) board 13 such that each of the projecting terminal ends 31' of center conductors 31 are inserted within a respective plated-thru-hole 17, which hole in turn is electrically connected to a respective one or more of the designated conductive layers within the board. Located within each of the respective holes 17 designed to accommodate one such pin 31' is an electrical socket member 51. Socket 51 is preferably frictionally inserted within the plated-thru-hole 17 to assume a relatively fixed position therein. Each socket 51 preferably includes a plurality (e.g., three) of depending tines 53 which grip the outer diameter of the projecting pin, when inserted, along predetermined locations thereon. Examples of socket members which may be used in the invention are known in the art, one particular example being sold by Augat, Inc., Attleboro Falls, Mass. under the trade name "Holtite Series Zero Profile Solderless Socket". These sockets are of beryllium-copper material and include gold plating thereon. Each socket functions to frictionally engage the pin's outer periphery and thus assure a sound connection with the respective thru-hole. Significantly, each pin is engaged by the respective socket in such a manner so as to enable pin removal during withdrawal of assembly 10.

In FIG. 1, there is shown a screw 61 which may be used to secure housing 41 in a fixed position relative to board 13. It is understood that other means may be used to accomplish this function, including clamps or the like. Attention is also directed to FIG. 6 for another version of maintaining this positioning relationship between housing 41 and board 13.

In accordance with the teachings herein, one particularly significant feature of the instant invention is the ability to provide sound, effective electrical grounding for each of the shield members 35 of coaxial cables 11 when assembly 10 is located adjacent board 13 (such that pins 31' are inserted within the designated conductive holes 17 thereof). This unique form of grounding assists in the prevention of electromagnetic interference to the respective center conductors of the closely spaced cables during board operation. Additionally, this grounding relationship substantially prevents cross-coupling between adjacent cables. Significantly, such grounding is attainable in a connector scheme wherein repeated pluggability is possible.

In order to accomplish the above, connector assembly 10 includes at least one spring contact 71 securely positioned within conductive housing 41 and thus electrically connected to the adjacent shielding members 35. Each spring contact 71 includes a projecting spring portion 73 which is designed for electrically engaging a conductive segment 75 located on the upper surface of board 13 and extending from (and thus connected to) a respective conductive hole 17. Each segment 75 may constitute an extension of the upper land area of the plated-thru-hole or may be provided by other means.

In FIG. 1, two spring contacts 71 are shown. It is understood, however, that in the broader aspects of the invention, only one such contact need be utilized to successfully achieve the necessary grounding for cables 11. Two or more such contacts 71 are preferred, however, to assure proper electrical performance and to provide tolerancing means to compensate for any possible non-planarity of the housing and/or circuit board adjacent surfaces and thereby assure that effective contact is made. It is thus further understood, of course, that the exact number of ground contacts 71 per housing will depend on the electrical performance requirements of the overall system.

Figure 2:
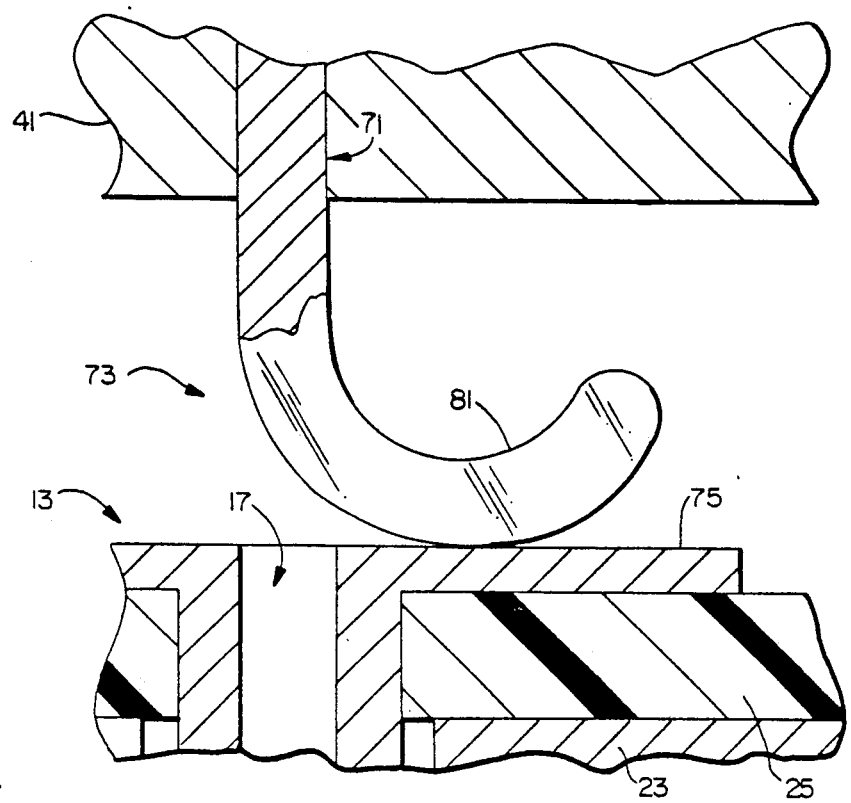
FIG. 2 is a partial side view, on an enlarged scale over FIG. 1, showing one embodiment of a spring contact which may form part of the electrical grounding means of the invention.

In FIG. 2, one of the spring contacts 71 can be seen on a much enlarged scale over the view of FIG. 1. In this view, the projecting resilient portion 73 can better be seen, said portion including a curvilinear end segment 81 which compresses against the extending conductive land segment 75 of board 13.

In FIG. 3, there is shown a connector assembly 10' in accordance with another embodiment of the invention. Assembly 10' is different from assembly 10 in that in this embodiment, an electrically insulative housing 41' is used. Each cable 11 is inserted within insulative (e.g., plastic) housing 41' with the projecting end segment thereof being inserted within a corresponding socket retained within a respective conductive hole, similarly to the embodiment in FIG. 1. However, in assembly 10', a spring contact 71' of different configuration is utilized. Additionally, the spring contact 71' in assembly 10' is electrically coupled to the conductive shield member 35' of each cable through a conductive layer 91 located on the bottom surface of housing 10'. This layer, in the form of a metal coating, is relatively thin (e.g. from about 0.0005 inch to about 0.001 inch) and is comprised of copper or copper alloy. Layer 91 extends from each shield member to the spring contacts 71'. To further assure sound contact between layer 91 and shields 35', each of the respective apertures 43' in housing 41' may include a conductive coating (not shown) thereon, said coating extending the appropriate full length of each hole and thereby in contact with said layer 91. Alternatively, and preferably, layer 91 extends upwardly within apertures 43' to thus form a continuous coating, thereby assuring a more reliable electrical ground connection. A coating of protective insulative material may be applied at selected locations on board 13 and/or housing 41, e.g., to prevent possible electrical shorting at undesired locations.

The embodiment of FIG. 3 enables provision of an electrically insulative housing and the advantages thereof. Suitable electrical connection to each of the grounding springs is attainable using this embodiment without extensive modification to the housing configuration as depicted in FIG. 1. It is possible, and perhaps preferable, to use a housing of substantially similar configuration as in FIG. 1, including particularly the indented portions thereof relative to the projecting end segments 31' of each cable 11 (such indentations being formed in the housing's bottom surface, as shown). With such a stepped configuration, if used in FIG. 3, coating 91 would extend thereover to be connected to the shield members 35' (which would extend to the outer surface of each indentation, as these do along the flat (planar) surface depicted in FIG. 3). Such an indented configuration may be preferred to further assure non-contact between the cable shield members and an upper conductive element, if present, on board 13. As seen in both FIGS. 1 and 3, the board configuration used in both of these embodiments are substantially identical.

Figure 4:
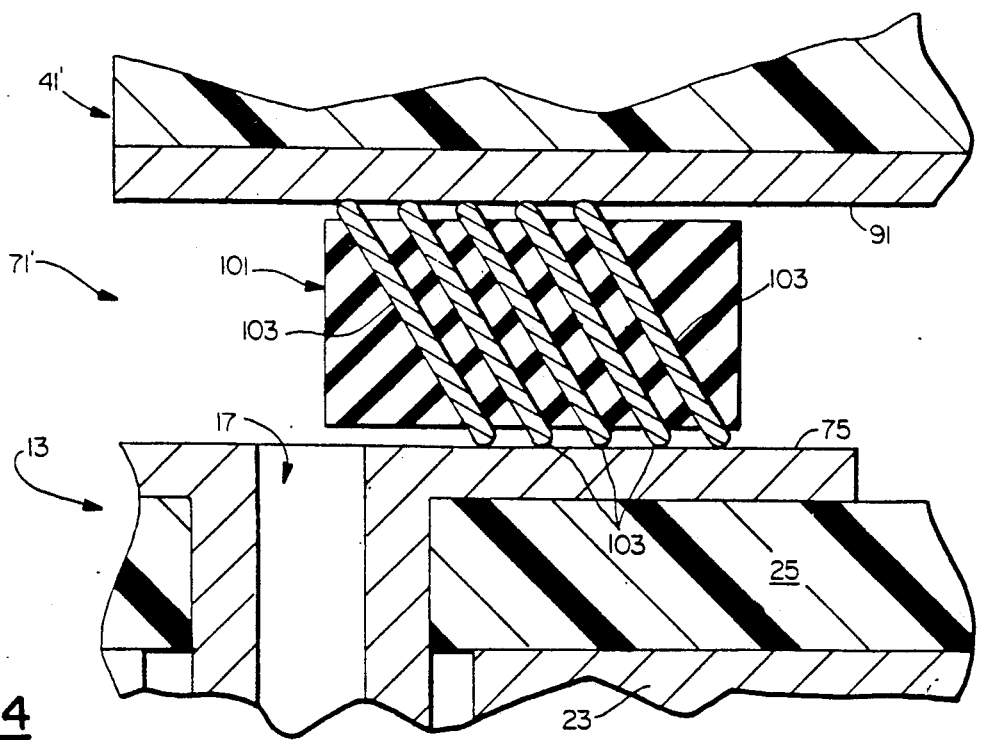
FIG. 4 is a partial side view, on an enlarged scale over FIG. 3, showing another embodiment of a spring contact, which contact may form part of the electrical grounding means for the connector assembly in FIG. 3.

In FIG. 4, there is shown a much enlarged view of spring contact 71' as may be used in the embodiment of FIG. 3. Spring contact 71' comprises a dielectric body portion 101, preferably of substantially boxlike configuration, and includes a plurality of wire conductors 103 extending therethrough. Each conductor is preferably copper or similar highly conductive material and is designed for engaging the conductive grounding layer 91 which, as defined, extends from and is electrically coupled to the shielding members of cables 11. Wires 103 are preferably attached to layer 91 (e.g., by welding, conductive epoxy adhesive, or solder) so as to retain contact 71' against housing 41'.

Contact 71' may be of different configurations than that depicted and described, including a configuration wherein body portion 101 is of substantially cylindrical configuration having wiring 103 substantially located thereabout. The invention is thus not limited to the particular configuration depicted in FIG. 4. It is essential, of course, that the spring contact 71' be compressible during engagement with the conductive land 75 of board 13.

Figure 5:
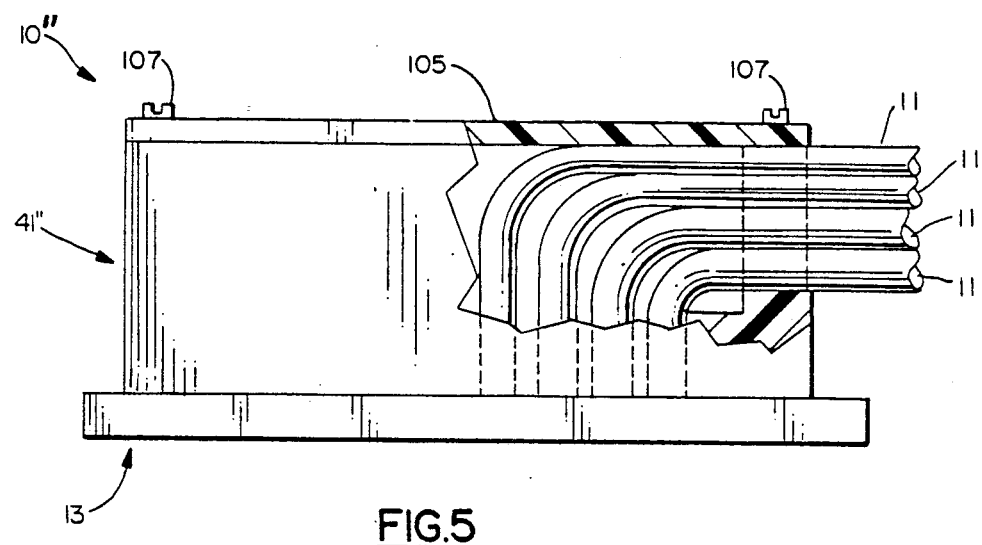
FIG. 5 illustrates one example of an assembly capable of retaining a plurality of coaxial cables therein in a tiered orientation, to thus assure a compact design.

In the embodiment of FIG. 5, there is shown in connector assembly 10" in accordance with another embodiment of the invention. Assembly 10", like assemblies 10 and 10', is designed for electrically connecting a plurality of coaxial cables 11 to a common circuit board 13. In the embodiment of FIG. 5, however, the coaxial cables 11 are arranged in a tiered orientation so as to reduce overall height of the connector housing 41". Housing 41" further includes a cover member 105 securable to a top portion thereof so as to retain the tiered ends of the coaxial cables 11 in the orientation depicted in FIG. 5. Cover 105, as well as the main body portion of housing 41", may be of plastic or similar insulative material. The cover is preferably secured to this main body portion by suitable means, e.g., screws 107.

Figure 6:
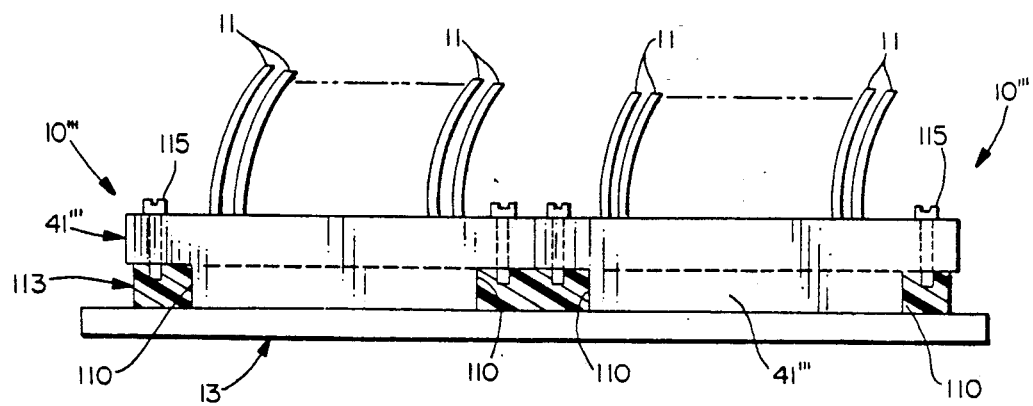
FIG. 6 illustrates at least two connector assemblies of the invention as being located in a side-by-side orientation with respect to a common circuit board, these assemblies being retained within a common frame member.

In FIG. 6, two adjacent connector assemblies 10'" are shown connected to a common circuit board 13. This adjacent positioning of two or more such connector assemblies thus assures means whereby several cables 11 may be directly connected to board 13. The housing 41'" of each connector assembly is preferably of stepped configuration (as shown) and includes a side indentation 110 for being positioned within a common frame member 113 which is designed for extending substantially about the restrained connector housings. Each housing in turn is preferably joined to the common frame 113 by suitable means e.g., screws 115. Frame 113 may in turn be secured to board 13 by suitable means (e.g., screws, clamps, adhesive, etc.), not shown. Frame 113 is preferably of insulative material, e.g., plastic, but may of course be of other material, including metallic.

Thus, there has been shown and described a connector assembly for electrically connecting a plurality of coaxial cables to a circuit board structure in such a manner that the assembly can be readily removed therefrom while still assuring a sound, effective connection between the respective connectors of each cable and the corresponding conductive holes in the board during the period of connection. The aforedescribed is attainable using an assembly of relatively simple construction which is operable in a relatively facile manner.

While there have been shown and described what are at present considered the preferred embodiments of the invention, it will be obvious to those skilled in the art that various changes and modifications may be made therein without departing from the scope of the invention as defined by the appended claims.

What is claimed is:

1. A connector assembly for electrically connecting a plurality of coaxial cables to a circuit board including an electrical ground, at least one electrically conductive segment on a surface thereof and a plurality of conductive holes as part thereof, said assembly comprising:

a common housing for being removably positioned adjacent said circuit board and including a plurality of apertures spacedly positioned therein in a high density arrangement, a plurality of said coaxial cables, each of said cables positioned within a respective one of said apertures and including a pin conductor therein for being positioned within a respective one of said conductive holes within said circuit board when said common housing is positioned adjacent said circuit board and a shielding member for electrically shielding said pin conductor; and grounding means located on or forming part of said common housing for providing an electrical connection between said shielding members of said coaxial cables and said electrical ground of said circuit board only when said common housing is positioned adjacent said circuit board, said grounding means including at least one spring contact located on a surface of said common housing or projecting therefrom at a location separate from and substantially adjacent at least one of said apertures having said coaxial cables therein, said spring contact electrically coupled to said shielding members and engaging said conductive segment on said surface of said circuit board in a resilient manner to provide said electrical connection between said shielding members and said electrical ground when said common housing is positioned adjacent said circuit board.

2. The connector assembly according to claim 1 wherein said common housing is comprised of metallic material.

3. The connector assembly according to claim 1 further including an electrical socket member located within each of said conductive holes, each of said pin conductors being located within a respective one of said socket members when said common housing is positioned adjacent said circuit board.

4. The invention according to claim 1 further including a second connector assembly located adjacent said connector assembly for electrically connecting a second plurality of coaxial cables to said circuit board, said connector assemblies being retained within a frame member.

5. The connector assembly according to claim 1 wherein said common housing is electrically conductive.

6. The connector assembly according to claim 5 wherein said common housing is comprised of conductive plastic material.

7. The connector assembly according to claim 5 wherein said shielding members of said coaxial cables extend within and are electrically coupled to said common housing.

8. The connector assembly according to claim 5 wherein said grounding means further includes a second spring contact located at a spaced distance from said first spring contact and at a location separate from and substantially adjacent a second one of said apertures having said coaxial cables therein.

9. The connector assembly according to claim 5 wherein said spring contact is metallic.

10. The connector assembly according to claim 1 wherein said common housing includes a body portion of electrically insulative material.

11. The connector assembly according to claim 10 wherein said body portion of said common housing is plastic.

12. The connector assembly according to claim 10 wherein said common housing further includes a conductive layer located on said surface thereof for electrically interconnecting said spring contact and each of said shielding members.

13. The connector assembly according to claim 12 wherein said grounding means further includes a second spring contact located at a spaced distance from said first spring contact and at a location separate from and substantially adjacent a second one of said apertures having said coaxial cables therein.

14. The connector assembly according to claim 12 wherein said spring contact comprises an elastomeric material having at least one connecting wire for contacting said conductive layer of said common housing and said circuit board to provide said electrical connection therebetween.

15. The connector assembly according to claim 1 wherein said coaxial cables are arranged within said common housing in a tiered orientation.

16. The connector assembly according to claim 15 wherein said common housing further includes a cover member, said cover member secured to said common housing to provide a cover for said coaxial cables therein.

* * * * *